United States Patent
Huesken et al.

(10) Patent No.: US 8,809,902 B2
(45) Date of Patent: Aug. 19, 2014

(54) POWER SEMICONDUCTOR DIODE, IGBT, AND METHOD FOR MANUFACTURING THEREOF

(75) Inventors: Holger Huesken, Munich (DE); Anton Mauder, Kolbermoor (DE); Hans-Joachim Schulze, Taufkirchen (DE); Wolfgang Roesner, Ottobrunn (DE)

(73) Assignee: Infineon Technologies Austria AG, Villach (AT)

( * ) Notice: Subject to any disclaimer, the term of this patent is extended or adjusted under 35 U.S.C. 154(b) by 87 days.

(21) Appl. No.: 13/274,411

(22) Filed: Oct. 17, 2011

(65) Prior Publication Data

US 2013/0092977 A1 Apr. 18, 2013

(51) Int. Cl.
*H01L 29/739* (2006.01)

(52) U.S. Cl.
USPC ........... 257/107; 257/109; 257/112; 257/139; 257/471; 257/475

(58) Field of Classification Search
CPC . H01L 29/36; H01L 29/66325; H01L 29/804; H01L 29/861; H01L 29/0485; H01L 29/0495; H01L 29/872
USPC ............ 257/109, 112, 478, E21.35, E21.351, 257/E29.066, E33.051; 438/420, 423
See application file for complete search history.

(56) References Cited

U.S. PATENT DOCUMENTS

| | | | |
|---|---|---|---|
| 4,587,547 A * | 5/1986 | Amemiya et al. | 257/655 |
| 5,668,385 A * | 9/1997 | Bauer et al. | 257/139 |
| 7,233,031 B2 | 6/2007 | Mauder et al. | |
| 2005/0035405 A1 | 2/2005 | Mauder et al. | |
| 2006/0011947 A1 * | 1/2006 | Juengling | 257/202 |

(Continued)

FOREIGN PATENT DOCUMENTS

| | | |
|---|---|---|
| DE | 19804580 A1 | 8/1999 |
| DE | 10361136 A1 | 7/2005 |

(Continued)

OTHER PUBLICATIONS

Yoshihito Amemiya, Takayuki Sugeta, Yoshihiko Mizushima, "Novel low-Loss and High Speed Diode Utilizing an 'Ideal' Ohmic Contact." IEEE Transactions on Electronic Devices, vol. Ed-29, No. 2, Feb. 1982.*

*Primary Examiner* — Tom Thomas
*Assistant Examiner* — John Bodnar
(74) *Attorney, Agent, or Firm* — Murphy, Bilak & Homiller, PLLC

(57) ABSTRACT

A power semiconductor diode is provided. The power semiconductor diode includes a semiconductor substrate having a first emitter region of a first conductivity type, a second emitter region of a second conductivity type, and a drift region of the first conductivity type arranged between the first emitter region and the second emitter region. The drift region forms a pn-junction with the second emitter region. A first emitter metallization is in contact with the first emitter region. The first emitter region includes a first doping region of the first conductivity type and a second doping region of the first conductivity type. The first doping region forms an ohmic contact with the first emitter metallization, and the second doping region forms a non-ohmic contact with the first emitter metallization. A second emitter metallization is in contact with the second emitter region.

21 Claims, 9 Drawing Sheets

(56) References Cited

U.S. PATENT DOCUMENTS

| | | | |
|---|---|---|---|
| 2008/0054369 A1* | 3/2008 | Schulze et al. | 257/378 |
| 2008/0246055 A1 | 10/2008 | Schulze et al. | |
| 2009/0140290 A1* | 6/2009 | Schulze et al. | 257/162 |
| 2009/0315036 A1* | 12/2009 | Zhang et al. | 257/76 |
| 2011/0147767 A1* | 6/2011 | Matsuse et al. | 257/77 |
| 2011/0207310 A1* | 8/2011 | Schulze et al. | 438/527 |

FOREIGN PATENT DOCUMENTS

| | | |
|---|---|---|
| DE | 10330571 B4 | 8/2006 |
| DE | 102006025958 B3 | 10/2007 |
| DE | 102006047244 A1 | 4/2008 |

* cited by examiner

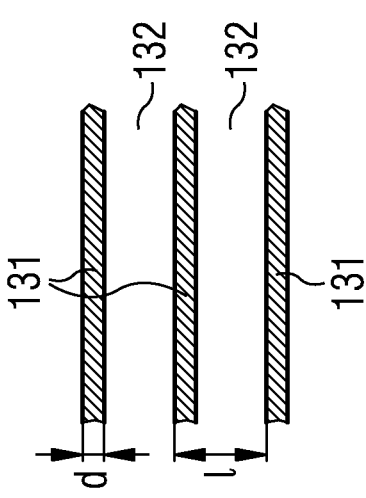
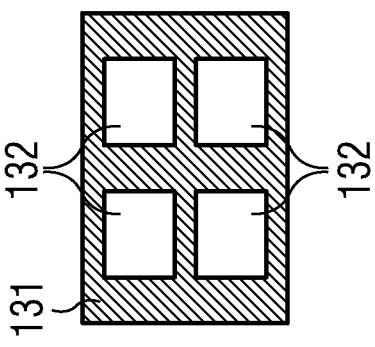

POWER SEMICONDUCTOR DIODE, IGBT, AND METHOD FOR MANUFACTURING THEREOF

TECHNICAL FIELD

Embodiments described herein relate to power semiconductor diodes, IGBTs, and methods for manufacturing power semiconductor diodes.

BACKGROUND

Semiconductor power diodes typically include an anode, a cathode and a drift region between the anode and the cathode. Switching losses of power semiconductor diodes are mainly caused by charges which are stored during on-state and which must be removed when bringing the diode into the blocking state. The stored charges, sometimes also referred to as flooding charge, are desired during on-state since they reduce the so-called on-state resistance $R_{ON}$. The amount of the stored charge is mainly determined by the injection efficiency of the anode, injection efficiency of the cathode and the ambipolar lifetime of the charge carriers in the drift region.

There are several attempts to optimise these parameters for example by providing special doping profiles for the anode and the cathode to adjust the lifetime of the charge carriers, for example to limit their lifetime. However, there are constrains for the maximum concentration of recombination centres since a high amount of recombination centres leads to a high leakage current.

When considering the cathode efficiency, a reduction of the doping concentration is desired which, on the other hand, increase the on-state resistance. Further attempts include local adjustment of the lifetime of the charge carriers. The cathode can further include n-doped regions in contact with p-regions which are arranged between the n-doped regions and the drift region to reduce the flooding of the drift region by charge carriers during on-state.

While these and other attempts partially improve the switching behaviour of diodes, there is still need for further improvement.

SUMMARY

According to one or more embodiments, a power semiconductor diode includes a semiconductor substrate having a first emitter region of a first conductivity type, a second emitter region of a second conductivity type, and a drift region of the first conductivity type arranged between the first emitter region and the second emitter region. The drift region forms a pn-junction with the second emitter region. A first emitter metallization is in contact with the first emitter region. The first emitter region includes a first doping region of the first conductivity type and a second doping region of the first conductivity type, wherein the first doping region forms an ohmic contact with the first emitter metallization, and the second doping region forms a non-ohmic contact with the first emitter metallization. A second emitter metallization is in contact with the second emitter region.

According to one or more embodiments, a power semiconductor diode includes a semiconductor substrate having a first emitter region, a second emitter region of a second conductivity type, and a drift region of a first conductivity type forming a pn-junction with the second emitter region. A second emitter metallization is in contact with the second emitter region. A first emitter metallization is in contact with the first emitter region. The first emitter region includes first doping regions of the first conductivity type forming ohmic contacts with the first emitter metallization and at least one second doping region of the first conductivity type laterally adjacent to the first doping regions forming a Schottky contact with the first emitter metallization.

According to one or more embodiments, an IGBT (insulated gate bipolar transistor) includes a semiconductor substrate having a source region of a first conductivity type, a body region of a second conductivity type, a drift region of the first conductivity type and an emitter region of the second conductivity type. A source metallization is in contact with the source region. An emitter metallization is in contact with the emitter region. The emitter region includes a first doping region of the second conductivity type forming an ohmic contact with the emitter metallization and a second doping region of the second conductivity type forming a non-ohmic contact with the emitter metallization.

According to one or more embodiments, a method for manufacturing a power semiconductor diode is provided. The method includes: providing a semiconductor substrate; forming a drift region of a first conductivity type, a second emitter region of a second conductivity type, a pn-junction between the second emitter region and the drift region, and a first emitter region having a first doping region of the first conductivity type and a second doping region of the first conductivity type; forming a first emitter metallization in contact with the first emitter region to form an ohmic contact between the first emitter metallization and the first doping region of the first emitter region, and to form a non-ohmic contact between the first emitter metallization and the second doping region of the first emitter region; and forming a second emitter metallization in contact with the second emitter region.

Those skilled in the art will recognize additional features and advantages upon reading the following detailed description, and upon viewing the accompanying drawings.

BRIEF DESCRIPTION OF THE DRAWINGS

The components in the figures are not necessarily to scale, instead emphasis being placed upon illustrating the principles of the invention. Moreover, in the figures, like reference numerals designate corresponding parts. In the drawings:

FIGS. 3A to 3C illustrate the arrangement of first and second doping regions according to various embodiments.

DETAILED DESCRIPTION

In the following Detailed Description, reference is made to the accompanying drawings, which form a part hereof, and in which are shown by way of illustration specific embodiments in which the invention may be practiced. In this regard, directional terminology, such as "top", "bottom", "front", "back", "leading", "trailing" etc., is used with reference to the orientation of the Figure(s) being described. Because components of embodiments can be positioned in a number of different orientations, the directional terminology is used for purpose of illustration and is in no way limiting. It is to be understood that other embodiments may be utilised and structural or logical changes may be made without departing from the scope of the present invention. The following detailed description, therefore, is not to be taken in a limiting sense, and the scope of the present invention is defined by the appended claims. The embodiments being described use specific language, which should not be construed as limiting the scope of the appended claims.

It is to be understood that features of the various exemplary embodiments described herein may be combined with each other, unless specifically noted otherwise. For example, features illustrated or described as part of one embodiment can be used in conjunction with features of other embodiments to yield yet a further embodiment. It is intended that the present description includes such modifications and variations.

The term "lateral" as used in this specification intends to describe an orientation parallel to the main surface of a semiconductor substrate.

The term "vertical" as used in this specification intends to describe an orientation, which is arranged perpendicular to the main surface of the semiconductor substrate.

In this specification, a first surface of a semiconductor substrate is considered to be formed by the lower or back-side surface while a second surface is considered to be formed by the upper, front or main surface of the semiconductor substrate. The terms "above" and "below" as used in this specification therefore describe a relative location of a structural feature to another structural feature with consideration of this orientation.

When referring to semiconductor devices, at least two-terminal bipolar devices are meant, an example is a diode. Semiconductor devices can also be three-terminal devices such as insulated gate bipolar transistors (IGBT). The semiconductor devices can also include more than three terminals. According to an embodiment, semiconductor devices are power devices.

Figure 1A:
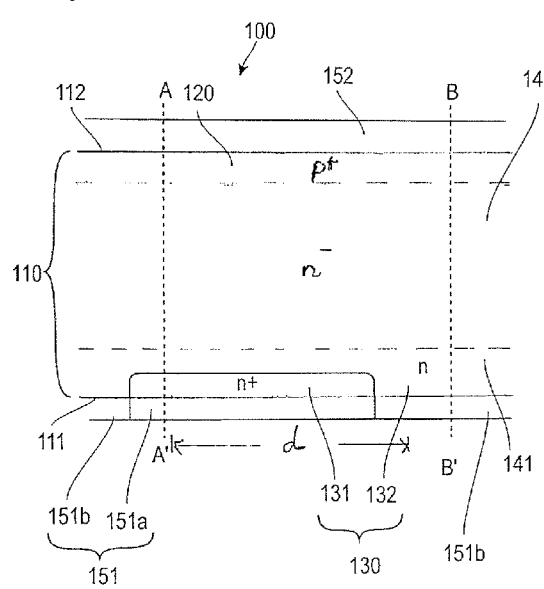
FIGS. 1A to 1C illustrate a power semiconductor diode according to an embodiment.
Figure 1B:
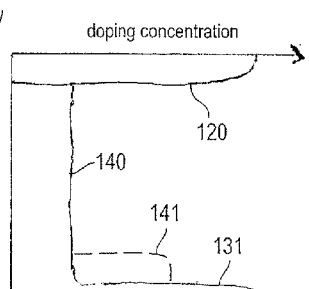
Figure 1C:
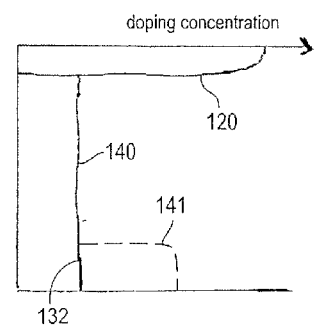

With reference to FIGS. 1A to 1C, a first embodiment of a power semiconductor diode 100 is described. The diode 100 includes a semiconductor substrate 110 having a first surface 111 and a second surface 112 opposite the first surface 111. A second emitter region 120 of a second conductivity type, which is p-type in this embodiment, is formed at the second surface 112 of the semiconductor substrate 110. A first emitter region 130 of a first conductivity type, which is n-type in this embodiment, is formed at the first surface 111 of the semiconductor substrate 110. A drift region 140 of the first conductivity type is formed between the second emitter region 120 and the first emitter region 130. The drift region 140 forms a pn-junction with the second emitter region 120. An optional field stop region 141 can be formed between the drift region 140 and the first emitter region 130. The field stop region 141 is of the same conductivity type (first conductivity type) as the drift region 140 and the first emitter region 130 and has a higher doping concentration than the drift region 140.

Although the first conductivity type is n-type and second conductivity type is p-type in this embodiment, the first conductivity type can also be p-type and the second conductivity can be n-type.

The first emitter region 130 includes at least a first doping region 131 and a second doping region 132. Both the first and second doping regions 131, 132 are of the same conductivity type (first conductivity type). However, the first doping region 131 has a higher surface doping concentration (denoted n+) than the second doping region 132 (denoted n).

The semiconductor substrate 110 can be made of any semiconductor material suitable for manufacturing semiconductor devices. Examples of such materials include, without being limited thereto, elementary semiconductor materials such as silicon (Si), group IV compound semiconductor materials such as silicon carbide (SiC) or silicon germanium (SiGe), binary, ternary or quaternary III-V semiconductor materials such as gallium arsenide (GaAs), gallium phosphide (GaP), indium phosphide (InP), gallium nitride (GaN), aluminium gallium nitride (AlGaN), indium gallium phosphide (InGaPa) or indium gallium arsenide phosphide (InGaAsP), and binary or ternary II-VI semiconductor materials such as cadmium telluride (CdTe) and mercury cadmium telluride (HgCdTe) to name few. The above mentioned semiconductor materials are also referred to as homojunction semiconductor materials. When combining two different semiconductor materials a heterojunction semiconductor material is formed. Examples of heterojunction semiconductor materials include, without being limited thereto, silicon ($Si_xC_{1-x}$) and SiGe heterojunction semiconductor material. For power semiconductor applications currently mainly Si, SiC and GaN materials are used. In the embodiments described herein, the semiconductor substrate 110 is comprised of Si.

Power semiconductor diode 100 further includes a second emitter metallization 152 arranged on the second surface 112 of the semiconductor substrate 110 and a first emitter metallization 151 arranged on the first surface 111 of the semiconductor substrate 110. The second emitter metallization 152 is in ohmic contact with the second emitter region 120. The first emitter metallization 151 is in ohmic contact with the first doping region 131 of the first emitter region 130. To ensure a reliable ohmic contact between the first doping region 131 and the first emitter metallization 151, the surface doping concentration of the first doping region 131 is at least $10^{19}/cm^3$ according to an embodiment. According to a further embodiment, the surface doping concentration of the first doping region 131 is at least $5*10^{19}/cm^3$.

Different thereto, the first emitter metallization 151 forms a non-ohmic contact with the second doping region 132 of the first emitter region 130. The surface doping concentration of the second doping region 132 of the first emitter region 130 is therefore lower than the surface doping concentration of the first doping region 131. According to an embodiment, the surface doping concentration of the second doping region 132 of the first emitter region 130 is less than $10^{19}/cm^3$. According to another embodiment, the surface doping concentration of the second doping region 132 of the first emitter region 130 is less than $10^{18}/cm^3$. According to a further embodiment, the surface doping concentration of the second doping region 132 of the first emitter region 130 is less than $10^{17}/cm^3$.

The first emitter region 130 forms a cathode region of the diode 100, and the second emitter region 120 forms an anode region 120 of the diode 100 according to an embodiment. Furthermore, the first emitter metallization 151 forms a cathode metallization on the first surface 111 of the semiconductor substrate 110 and in direct contact therewith. The second emitter metallization 152 forms an anode metallization on the second surface 112 of the semiconductor substrate 110 and in direct contact therewith.

When referring to the surface doping concentration of a doping region, the doping concentration at the surface of the doping region is meant. The surface doping concentration can be different to the mean or peak doping concentration of the doping region. Typically, the surface doping concentration is lower than the mean or peak doping concentration due to implantation of the dopants into a given distance from the surface.

When referring to an ohmic contact, a contact between two regions, particularly between a metal and a semiconductor region which are in direct contact, is meant which has a symmetrical characteristic. Non-ohmic contacts have non-symmetric characteristics like pn-junctions or Schottky-junctions.

According to an embodiment, the first emitter region 130 is structured to include at least one first doping region 131 having a higher surface doping concentration than at least one second doping region 132. The first emitter region 130 has therefore a varying lateral surface doping concentration. According to an embodiment, the first emitter region 130 includes a plurality of spaced apart first doping regions 131 extending to the first surface 111 of the semiconductor substrate 110. According to an embodiment, the first emitter region 130 includes a plurality of spaced apart second doping regions 132 extending to the first surface 111 of the semiconductor substrate 110. According to an embodiment, the first emitter region 130 includes a plurality of first and second doping regions 131, 132 extending to the first surface 111 of the semiconductor substrate 110.

According to an embodiment, dopants are implanted into the first surface 111 of the semiconductor substrate 110 using a mask for forming the structured first emitter region 130. A higher dose is used for forming the first doping regions 131 in comparison to the formation of the second doping regions 132. Hence, a high dose implantation is not carried out globally but locally on selected areas defined e.g. by a mask. The regions having a high surface doping concentration, and also a high peak concentration, cover an area which is less than the total area of the first surface 111.

The surface doping concentration of the first doping regions 131 can be higher than the surface doping concentration of the second doping regions 132 by a factor of at least 10 or at least 100, or even at least 1000. The first doping regions 131 form areas, for example a plurality of spaced apart areas, having a high conductivity and high emitter efficiency. The first doping regions 131 also provide a good ohmic contact to the first emitter metallization 151. Between the spaced apart first doping regions 131 are disposed the second doping regions 132 having a lower emitter efficiency and a lower conductivity than the first doping regions 131. The second doping regions 132 form, according to an embodiment, Schottky contacts with the first emitter metallization 151, i.e. the non-ohmic contacts are Schottky contacts. The surface doping concentration of the second doping regions 132 can be selected according to specific needs. Typically, the surface doping concentration of the second doping regions 132 is sufficiently lower in comparison to the surface doping concentration of the first doping region 131 to ensure formation of a Schottky contact with the first emitter metallization 151.

The lower limit of the doping concentration in the second doping regions 132 (lower doped regions) may be selected in view of the desired blocking voltage of the diode 100. For example, the electrical field under reverse bias should not reach the first emitter metallization 151. This can be provided for by having an integral dose, starting from the pn-junction towards the first emitter metallization 151, which is equal or higher than the break-through charge which can be, depending on the background doping, between about 1 to $2*10^{12}/cm^2$ for silicon. This is typically the case when having a field stop region 141 as illustrated in FIG. 1A. The required dose may be provided by the second doping regions 132, the doping concentrations of which may be adjusted accordingly.

As illustrated in FIG. 1A, second doping region or regions 132 can be formed by portions of the field stop region 141. In this case, the second doping regions 132 have the same doping concentration as the field stop region 141. In further embodiments without the field stop region 141, the second doping region or regions 132 can be formed by portions of the drift region 140 so that the second doping regions 132 have the same doping concentration as the drift region 140. In further embodiments, the second doping regions 132 have a higher doping concentration than the drift region 140 and the field stop region 141 if the field stop region 141 is integrated.

The doping profile along vertical line AA' extending through the first doping region 131 is illustrated in FIG. 1B. The doping concentration of the first doping region 131 is significantly higher than the doping concentration of the drift region 140 and also of the optional field stop region 141, and is also very high at the first surface 111 of the semiconductor substrate 110. Different thereto, the doping concentration of the second doping region 132 is the same as that of the drift region 140 when no field stop region 141 is provided and equals the doping concentration of the field stop region 141 when such a region is provided. FIG. 1C illustrates the doping profile along vertical line BB' passing through second doping region 132.

The first doping regions 131 can be formed by spaced apart separate regions or can be one connected region. The second doping regions 132 can also be formed by spaced apart separate regions or can be one connected region. According to an embodiment, the power semiconductor diode 100 includes one connected second doping region 132 and a plurality of spaced apart first doping regions 131 which are laterally spaced by areas of the second doping region 132. According to an embodiment, the power semiconductor diode 100 includes one connected first doping region 131 and a plurality of spaced apart second doping regions 132 which are laterally spaced by areas of the second doping region 131. According to further embodiments, the power semiconductor diode 100 includes a plurality of first and second doping regions 131, 132 which are alternatingly arranged.

Figure 3A:
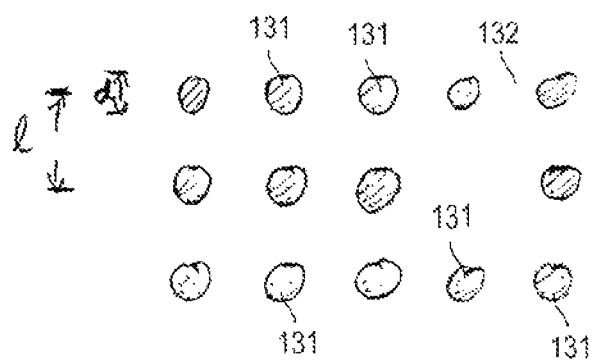

FIGS. 3A to 3C illustrate several layouts for the arrangement of the first doping regions 131 and the second doping region 132 when seen onto the first surface 111 of the semiconductor substrate 110. According to an embodiment, the first doping regions 131 can be formed as spaced apart spots or circular doping regions arranged within a singly connected second doping region 132 as illustrated in FIG. 3A. According to a further embodiment, the first and second doping regions 131, 132 can be formed as alternating strips as illustrated in FIG. 3B. According to yet another embodiment, the first doping region 131 can be formed as singly connected doping region surrounding a plurality of the second doping regions 132 as illustrated in FIG. 3C. The arrangement of the first and second doping regions 131, 132 can be exchanged in the illustrated layouts.

Specific embodiments includes at least one of the following arrangements:
  circles of the first doping regions 131 embedded in a single second doping region 132;
  circles of the second doping regions 131 embedded in a single first doping region 131;
  alternating stripes of the first and second doping regions 131, 132;
  polygonally shaped first doping regions 131, such as rectangles and hexagons, embedded in a single second doping region 132;

polygonally shaped second doping regions 132, such as rectangles and hexagons, embedded in a single first doping region 131;

regularly arranged first doping regions 131 and second doping regions 132 with selective modifications as described further below;

polygonally shaped first doping regions 131, such as rectangles and hexagons, and/or regularly arranged first doping regions 131 embedded in a single second doping region 132, wherein the regular arrangement includes defects, for example by omitting first doping regions 131 at selection locations (see FIG. 3A showing a missing first doping region in the otherwise regularly arranged first doping regions 131);

any of the above mentioned arrangements, wherein the regularly arranged first and/or second doping regions 131, 132 are only arranged within the active area of the power diode as described further below.

The specific layout and the geometrical relation between the first and second doping regions 131, 132 can be selected according to specific needs to adjust the electrical characteristic of the power diode 100. The emitter efficiency of the first emitter region 130 can be adjusted, for example, by selecting geometrical parameters d and l as indicated in FIGS. 3A to 3C. Moreover, the emitter efficiency can be adjusted by selecting appropriate area relations between the total area covered by the first doping regions 131 relative to the total area covered by the second doping regions 132.

The Schottky contacts formed between the second doping regions 132 and the first emitter metallization 151 is beneficial for operational reasons. At higher temperatures and current density, which occur during operation, carrier injection of the second doping regions 132 increases since the resistance formed by the Schottky contacts decreases with temperature. This allows the device to have higher surge currents in comparison to devices having a constant lateral doping. Diodes having Schottky contacts formed at the junction between first emitter metallization 151 and semiconductor substrate 110 exhibit an improved characteristic, for example a reduced increase of the forward voltage with increasing current in comparison to conventional diodes. The forward voltage reflects the on-state resistance of the device and hence the magnitude of the losses. The differential resistance for the rated current and for high currents can be adjusted by appropriately selecting the design and layout of the first and second doping regions 131, 132 as illustrated further below.

The field stop region 141 can be formed, for example, by implantation of protons. This allows an independent adjustment of the surface doping concentration of the first and second doping regions 131, 132 with respect to the integral dose of the field stop region 141. The surface doping concentration of the second doping regions 132 defines the characteristics of the Schottky contact. Proton implantation results in a doping profile having a maximum dose in the depth of the semiconductor substrate, wherein the depth of the maximum can be controlled by the implantation energy, and the integral dose by the implantation dose. The surface doping concentration, which defines the contact resistance of the Schottky contact and thus its temperature characteristic, can be adjusted by both the implantation dose and an annealing step following the implantation. According to an embodiment, an annealing step is therefore carried out to adjust the surface doping concentration of the second and/or the first doping regions 131, 132.

According to an embodiment, the first doping region 131 includes first dopants and the second doping region 132 includes second dopants different to the first dopants but of the same doping type. The first and second dopants can form respective first and second donors when appropriate dopants are selected. For example, the second donors can have an energy level different to the energy lever of the first donors. For example, the second donors can have a lower energy level than the energy lever of the first donors. Low energy level donors (second donors) can also be used for forming the field stop region 141. It is therefore possible to form second doping regions 132 with low level donors independent to the field stop region 141 or together with the field stop region 141. Using low energy level donors is particularly beneficial since the desired temperature characteristic of the charge carrier injection of the second doping regions 132 can be further enhanced because the effective concentration and thus the injections efficiency (emitter efficiency) of the second doping regions (low doped regions) increases with temperature. The low energy level donors (second donors) can be formed by implantation of second dopants according to an embodiment. Subsequent thereto, a laser anneal can be carried out which is particularly beneficial when the second dopants are only implanted into the second doping regions 132 without forming a field stop region 141 since laser annealing can be very short and prevents unwanted diffusion. Alternatively, a furnace anneal can be performed to drive in the second dopants which is particularly beneficial when forming the second doping regions 132 and the field stop region 141 together, for example when portions of the field stop region 141 extending to the first surface 111 form second doping regions 132. An independent and separate formation of the field stop region 141 and the second doping regions 132 is also possible and provides more freedom in adjusting the electrical characteristics, for example for preventing or reducing current filamentation and thermomigration of the characteristic.

According to an embodiment, the second donors are formed by dopants selected from the group consisting of selenium, sulphur, bismuth and titanium. Particularly selenium and sulphur are beneficial.

According to an embodiment, the first emitter metallization 151 includes a first metal region 151a comprised of a first metal and a second metal region 151b comprised of a second metal different than the first metal. The first metal region 151a is in contact with the first doping region 131 of the first emitter region 130 and the second metal region 151b is in contact with the second doping region 132 of the first emitter region 130. Using different metals for contacting the first and second doping regions 131, 132 provides more freedom in choosing the desired characteristics. This is particularly beneficial for the second doping regions 132 forming Schottky contacts since different metals form Schottky contacts with different characteristics.

According to an embodiment, the first metal is comprised of aluminium, aluminium alloy, or titanium. According to an embodiment, the second metal is comprised of titanium, titanium alloy, tungsten or tungsten alloy.

According to an embodiment, the drift region 140 has a doping concentration lower than the doping concentration of the first doping region 131 of the first emitter region 130 and is at least in direct contact with the first doping region 131 of the first emitter region 130. The drift region 140 and the first doping region 131 are therefore in direct contact without any other doping regions such as complementary doped regions as conventionally used to adjust the emitter efficiency of first emitter regions. Hence, the diode 100 has a simpler layout and a more robust performance than conventional devices.

According to an embodiment, the field stop region 141 between the drift region 140 and the first emitter region 130 has a doping concentration which is higher than that of the drift region 140 and lower than that the first doping region 131 of the first emitter region 130, wherein the field stop region 141 is at least in direct contact with the first doping region 131 of the first emitter region 130. The field stop region 141 and the first doping region 131 are in direct contact with each other so that an nn- or a pp-junction, depending on the conductivity type, is formed between the field stop region 141 and the first doping region 131. Additional complementarily doped regions are also not needed here. Furthermore, no structured field regions are needed which are sometimes used to improve the electrical characteristics.

The above described variations are particularly beneficial for medium blocking voltage devices, for example in a range from about 500 V to 1200 V. For higher blocking voltage devices, additional complementarily doped regions may be provided.

Figure 4A:
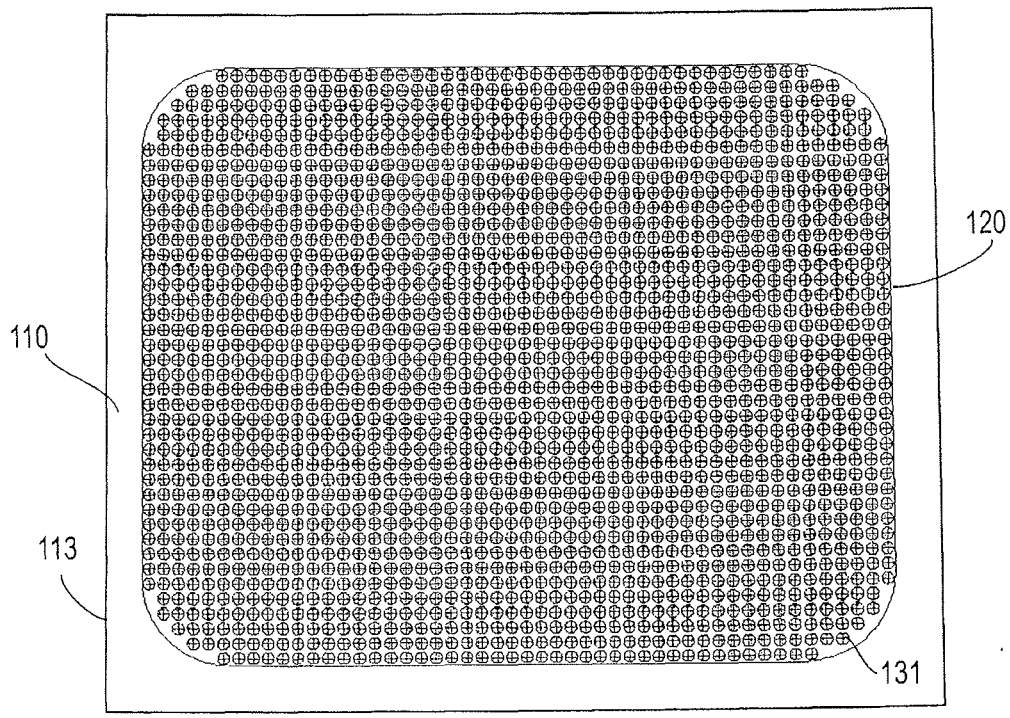
FIGS. 4A and 4B illustrate the arrangement of first doping regions according to various embodiments.
Figure 4B:
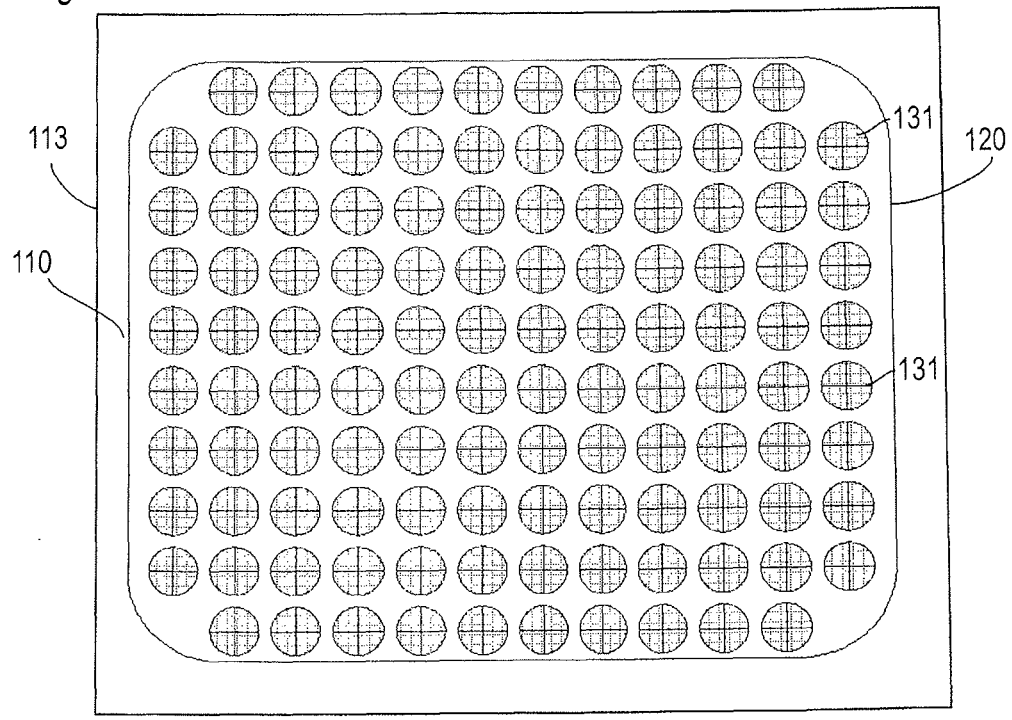

According to an embodiment, the semiconductor substrate 100 includes a lateral edge 113 as illustrated in FIGS. 4A and 4B. The second emitter region 120 is spaced apart from the lateral edge 113. The first doping regions 131 are formed within an area formed by projecting the second emitter region 120 onto the first surface 111 as illustrated in FIGS. 4A and 4B. FIGS. 4A and 4B illustrate different layouts of circular first doping regions 131, when seen onto the first surface 111. When comparing FIGS. 4A and 4B, the first doping regions 131 have different diameters and are placed along grids having a different pitch. The structuring of the first emitter region 130 is thus restricted to the active area of the power diode 100 defined by the lateral extension of the second emitter region 120. The first doping regions 131 are therefore only formed within the active area according to an embodiment. Furthermore, Schottky contacts are formed within the active area according to an embodiment.

For example, FIG. 4A illustrates a layout of the first emitter region 130 including a plurality of first doping regions 131 shaped as dots or circles which have a diameter of 20 μm and which are arranged on a grid having a pitch of 25 μm. FIG. 4B illustrates a layout of a first emitter region 130 including a plurality of first doping regions 131 shaped as dots or circles which have a diameter of 80 μm and which are arranged on a grid having a pitch of 100 μm. According to a further embodiment, a layout of a first emitter region 130 includes a plurality of first doping regions 131 shaped as dots or circles which have a diameter of 10 μm and which are arranged on a grid having a pitch of 12.5 μm. In all of the above embodiments, the total area of the first doping regions 131 is about 50% of the area covered by the second emitter region 120 when projected onto the first surface 111. In further embodiments, the pitch can be varied while keeping the size of each of the first doping area 131 constant to vary the area ratio of the first doping regions 131 relative to the second doping region 132 or to the projected area of the second emitter region 120.

In the above embodiments, the first doping regions 131 are formed up to the edge of the projected second emitter region 120. In further embodiments, the first doping regions 131 can be formed in an area (smaller area) which is smaller than the area of the projected second emitter region 120. This smaller area can be, for example, reduced to have a distance between the outer edge of the projected area of the second emitter region 120 and the outer edge of the smaller area is circumferentially formed. Alternatively, the first doping regions 131 can be formed in an area (larger area) which is larger than the area of the projected second emitter region 120. Typically, the first doping regions 131 are formed in aligned relation with the second emitter region 120, i.e. the mask used during implantation is aligned with respect to the second emitter region 120.

According to an embodiment, as for example illustrated in FIG. 1, a power semiconductor diode 100 includes a semiconductor substrate 110 having a second emitter region 120 of a second conductivity type, a drift region 130 of a first conductivity type forming a pn-junction with the second emitter region 120, and a first emitter region 130. A second emitter metallization 152 is in contact with the second emitter region 120 and a first emitter metallization 151 is in contact with the first emitter region 130. The first emitter region 130 includes first doping regions 131 of the first conductivity type forming ohmic contacts with the first emitter metallization 151 and second doping regions 132 of the first conductivity type laterally adjacent to the first doping regions 131 forming Schottky contacts with the first emitter metallization 151. The power semiconductor diode 100 can be modified as described above.

Figure 2:
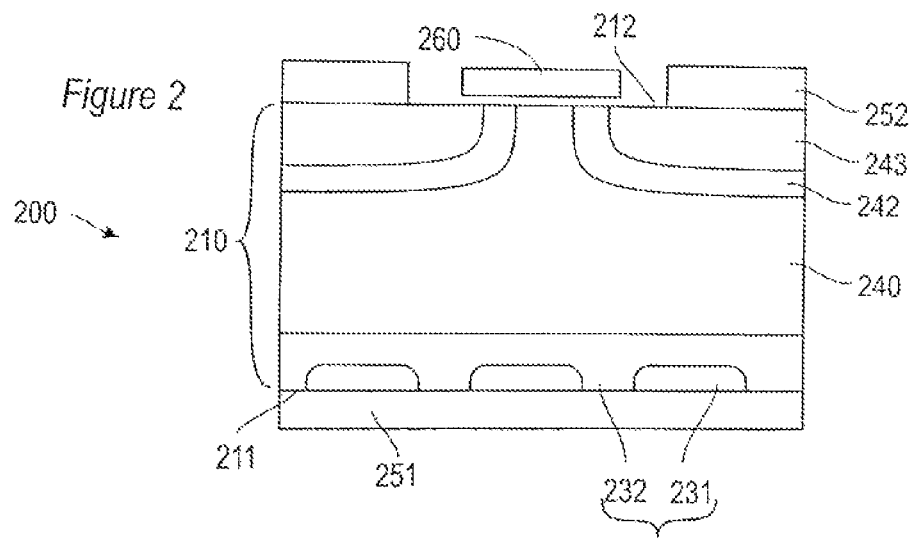
FIG. 2 illustrate an IGBT according to an embodiment.

According to an embodiment, as for example illustrated in FIG. 2, an IGBT 200 is provided. The IGBT 200 includes a semiconductor substrate 210 having a source region 243 of a first conductivity type, a body region 242 of a second conductivity type, a drift region 240 of the first conductivity type and an emitter region 230 of the second conductivity type. A source metallization 252 is in contact with the source region 243 and an emitter metallization 251 is in contact with the emitter region 230. The emitter region 230 includes a first doping region 231 of the second conductivity type and a second doping region 232 of the second conductivity type. The first doping region 231 forms an ohmic contact with the emitter metallization 251. The second doping region 232 forms a non-ohmic contact with the emitter metallization 251. The first doping region 231 can have a higher surface doping concentration than the second doping region 232.

The semiconductor substrate 210 can be any one of the above described semiconductor materials and includes a first surface 211 and a second surface 212. A gate electrode 260 is insulated with respect to the semiconductor substrate 210. The emitter region 230 includes first and second doping regions 231, 232 and the emitter metallization 251 can be formed and adapted as described above in connection with the first emitter region 130 and the first emitter metallization 151.

According to an embodiment, a method for manufacturing the power semiconductor diode 100 includes at least one of the following processes.

First, a semiconductor substrate 110 is provided. In a further process, a drift region 140 of the first conductivity type, an second emitter region 120 of the second conductivity type, a pn-junction between the second emitter region 120 and the drift region 140, and a first emitter region 130 having a first doping region 131 of the first conductivity type and a second doping region 132 of the first conductivity type are formed. The first doping region 131 can have a higher surface doping concentration than the second doping region 132. Typically, the second emitter region 120 and the first emitter region 130 are formed by implantation, wherein the second emitter region 120 is formed at the second surface 112 of the semiconductor substrate 110 and the first emitter region 130 is formed at the first surface 111 of the semiconductor substrate 110.

For forming the first and/or second doping regions 131, 132 of the first emitter region 130, an implantation mask is formed on the first surface 111 and then suitable dopants, as for example described above, are implanted.

In a further process, a second emitter metallization 152 is formed on and in contact with the second emitter region 120. Typically, the second emitter metallization 152 forms an ohmic contact with second emitter region 120. In a further process, a first emitter metallization 151 is formed on and in contact with the first emitter region 130 to form an ohmic contact between the first emitter metallization 151 and the first doping region 131 of the first emitter region 130, and to form a non-ohmic contact between the first emitter metallization 151 and the second doping region 132 of the first emitter region 130. The non-ohmic contact is typically a Schottky contact. To this end, the doping doses for the first and second doping regions 131, 132 are selected as described above. Alternatively, no additional dopants are implanted into the second doping region 132, for example when an optional field stop region 141 has been formed, and dopants are only implanted into the first doping region 131.

According to an embodiment, first dopants are implanted into the first doping region 131 to form first donors. Second dopants different than the first dopants but of the same doping type are implanted into the second doping region 132 to form second donors. The second donors can form an energy level lower than the first donors in the semiconductor substrate 110 as described above.

According to an embodiment, dopants are implanted into the first doping region 131 with higher dose than into the second doping region 132 to obtain a higher surface doping concentration of the first doping region 131 relative to the second doping region 132.

According to an embodiment, an annealing process is carried out after implantation. The annealing process can be a laser anneal. Alternatively or additionally, the annealing process can be a furnace.

According to an embodiment, a further process includes formation of a first metal region 151a comprised of a first metal in contact with the first doping region 131 of the first emitter region 130 and forming a second metal region 151b comprised of a second metal different to the first metal in contact with the second doping region 132 of the first emitter region 130 as described above.

According to an embodiment, a further process includes implanting protons to form a field stop region 141 adjacent to the first emitter region 130 as described above.

According to an embodiment, the method further includes modifying the first surface 111 of the first emitter region 130 by at least one of implanting non-doping elements, and locally or globally porosifying the surface of the first emitter region 130. These processes can be used to modify the recombination of the charge carriers on the semiconductor-metal interface (between first/second doping region 131, 132 and the first emitter metallization 151), particularly in the region of the Schottky contacts formed between the second doping regions 132 and the first emitter metallization 151. This contact surface between the semiconductor regions 131, 132 and the first emitter metallization 151 can be additionally modified by a damage implantation using non-doping elements. Examples are argon, silicon and germanium. Alternatively, the contact surface can be porosified either locally or globally. It is also possible to form recombination regions spaced apart from the interface between the semiconductor regions 131, 132 and the first emitter metallization 151, for example in a given distance to the first surface 111.

According to an embodiment, the first surface 111 is amorphized by a phosphorous implantation with a dose of, for example $4*10^{14}/cm^2$, followed by the deposition of the first emitter metallization 151. An annealing step at elevated temperatures, for example between 350° C. and 420° C. can follow. This leads to a so-called metal enhanced solid phase epitaxy (ME-SPE) which allows formation of ohmic contacts having low emitter efficiency.

According to an embodiment, the lifetime of the charge carriers within the semiconductor substrate 110 can be additionally adapted by implanting lifetime-limiting elements such as platinum.

The above described processes and structures are suitable for thin-wafer processes since the used processes such as lithography, ion implantation and annealing processes are compatible with commonly used carrier systems for thin wafers.

Figure 5:
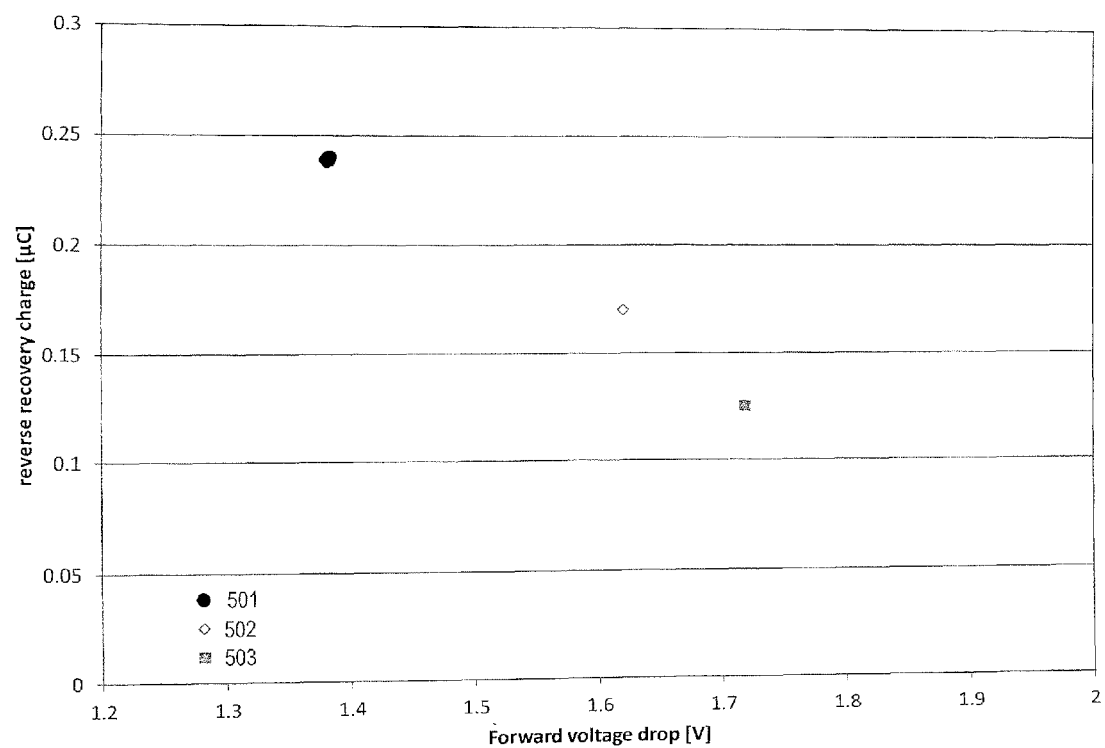
FIG. 5 illustrates experimental results carried out to determine the reverse recovery charge for different layouts of the first emitter region.

With reference to FIG. 5, experimental results carried out to determine the reverse recovery charge for different layouts of the first emitter region are described. Point 501 indicates the result for a diode having a homogenously doped first emitter region (cathode region) as commonly used. Point 502 indicates the result for a diode having a structured first emitter region as illustrated in FIG. 4B while point 503 indicates the result for a diode having a structured first emitter region as illustrated in FIG. 4A. First doping regions of diodes for points 502 and 503 have the same doping concentration as the first emitter region of the homogeneously doped diode of point 501.

As can be gathered from the experimental results, the reverse recovery charge, which floods the drift region, is significantly lower for first emitter regions having first and second doping regions as described above. Furthermore, the amount of the reverse recovery charge can be adjusted by appropriately selecting the layout design of the first and second doping regions.

Figure 6:
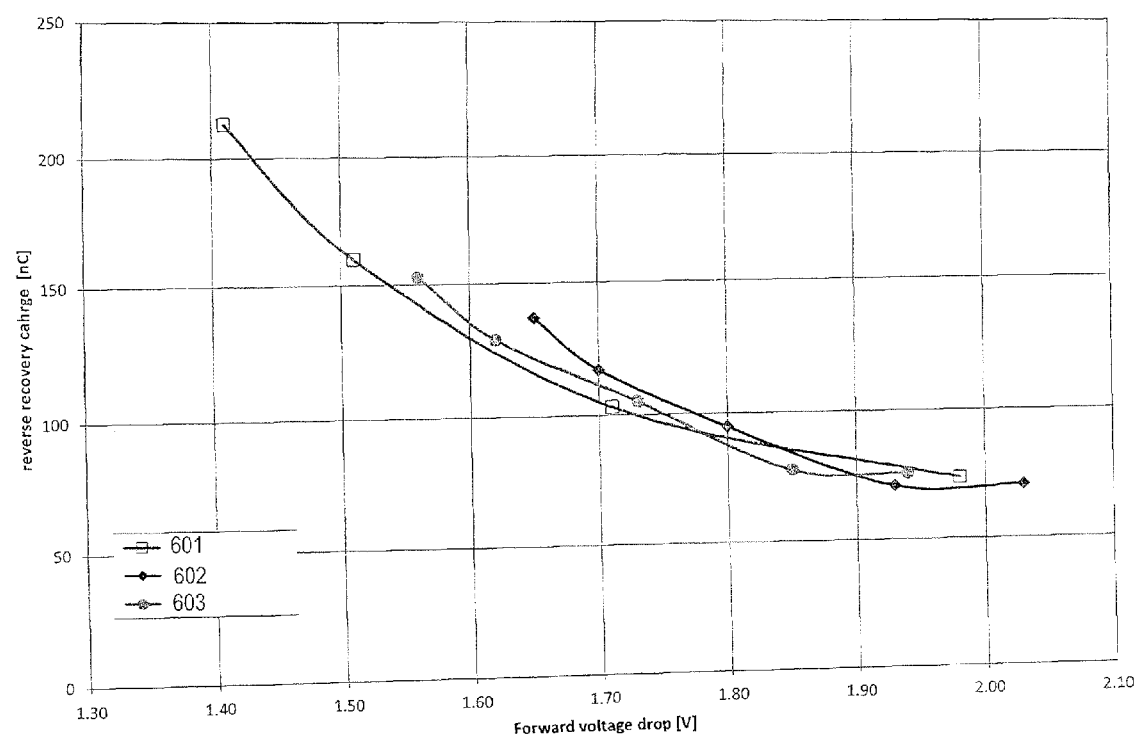
FIG. 6 illustrates simulation results of the reverse recovery charge for different layouts of the first emitter region.

FIG. 6 illustrates simulation results of the reverse recovery charge for different layouts of the first emitter region. Curve 601 illustrates the simulation results for a diode having a homogenously doped first emitter region (cathode region) as commonly used. Curve 602 illustrates the simulation results for a diode having a structured first emitter region, wherein the total area of the first doping regions covers an area of about 50% of the total area of the first emitter region. Curve 603 indicates the simulation results for a diode having a structured first emitter region, wherein the total area of the first doping regions covers an area of about 71% of the total area of the first emitter region. In curve 601, the points indicate different doses, wherein the most left point of curve 601 refers to a dose of $10^{15}/cm^2$ used for manufacturing the homogeneous first emitter region and the most right one to $10^{12}/cm^2$. The other two refer to $10^{14}/cm^2$ and $10^{13}/cm^2$, respectively.

For curves 602 and 603, the size of the first doping regions reduces from left to right while keeping the total area of the first doping regions constant to simulate a variation of the layout design.

FIG. 6 shows that the reverse recovery charge can be reduced by varying the layout design.

Figure 7:
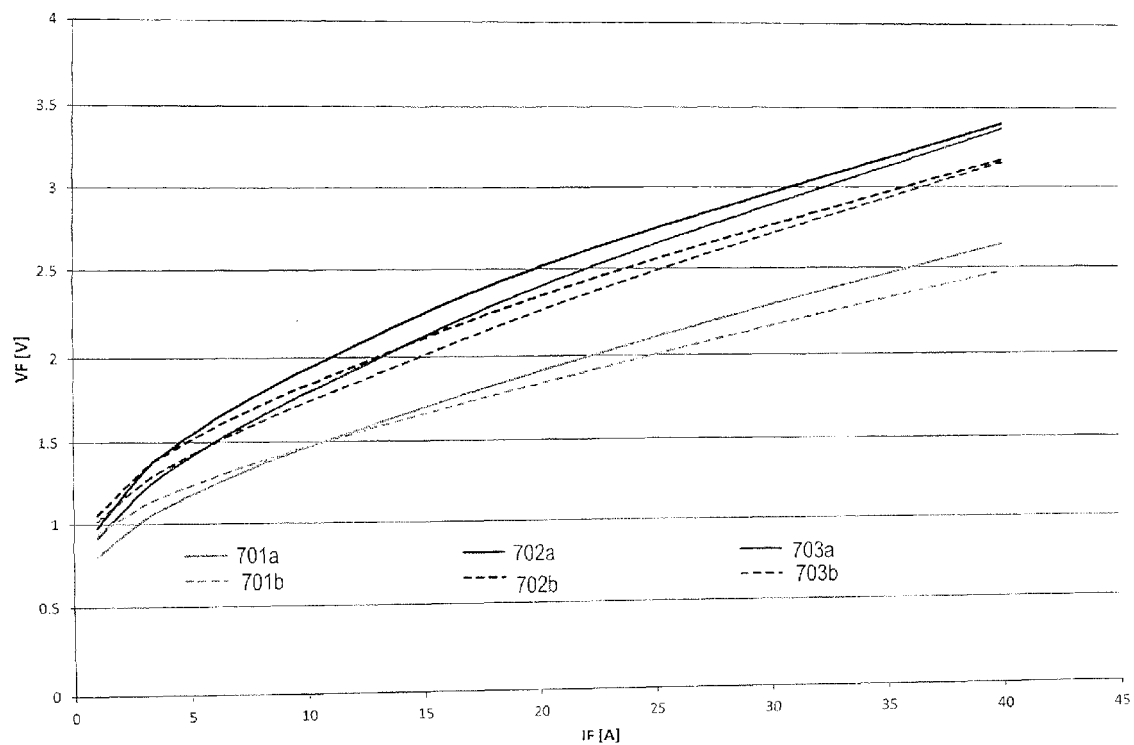
FIG. 7 illustrates measured characteristics of power diodes having different layouts of the first emitter region.

FIG. 7 illustrates measured characteristics of power diodes having different layouts of the first emitter region. The characteristics 701a and 701b relate to a diode having a homogeneous first emitter region (cathode region), characteristics 702a, 702b relate to a diode having a first emitter region as illustrated in FIG. 4A, and characteristics 703a, 703b relate to a diode having a first emitter region as illustrated in FIG. 4B. The characteristics denoted by "a" are measured at 125° C. and the characteristics denoted by "b" are measured at 25° C. Although the forward voltage drop $V_F$ seems to be larger for diodes having a structured first emitter region, their reverse recovery charge is smaller which is particularly important for fast switching applications.

Figure 8:
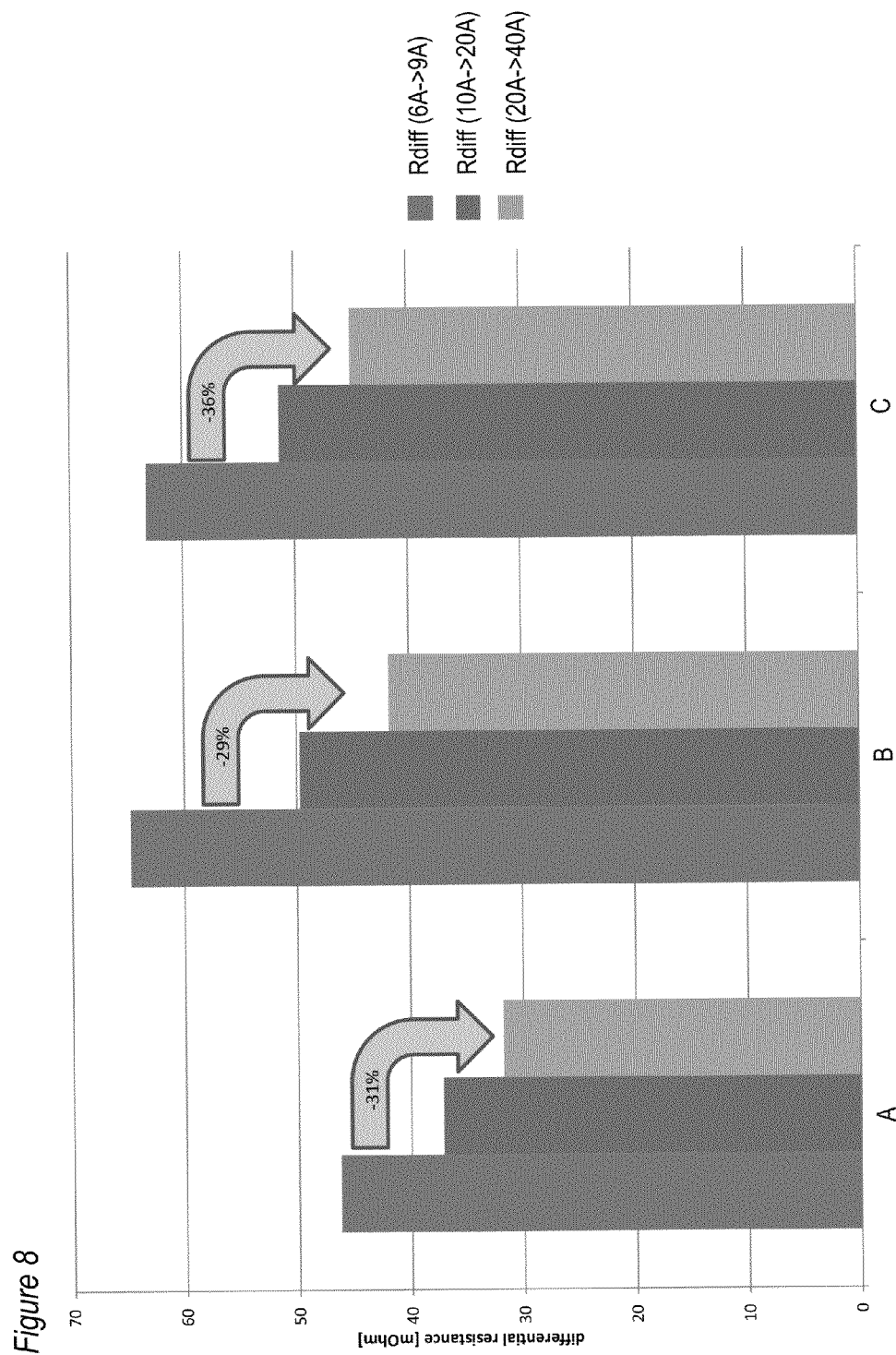
FIGS. 8 and 9 illustrates the differential resistance derived from the FIG. 7 for different temperatures.
Figure 9:
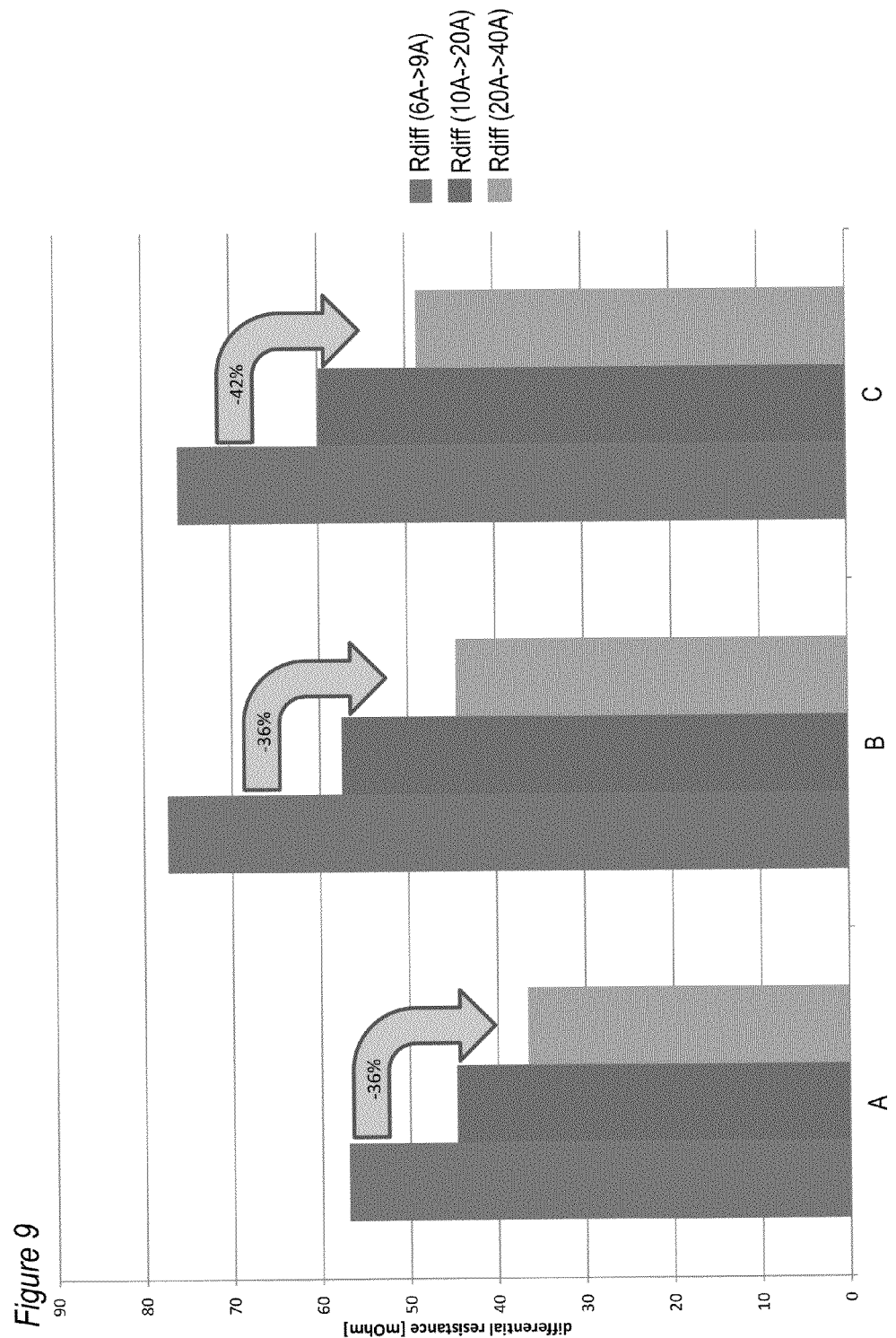

FIGS. 8 and 9 illustrates the differential resistance derived from the FIG. 7 for different temperatures. Group "A" denotes diodes having a homogeneous first emitter region (derived from characteristics 701*a* and 701*b*), "B" denotes diodes having an first emitter region as illustrated in FIG. 4A (derived from characteristics 702*a* and 702*b*), and "C" denotes diodes having an first emitter region as illustrated in FIG. 4B (derived from characteristics 703*a* and 703*b*). FIG. 8 illustrates the results for 25° C. while FIG. 9 for 125° C. The ranges for which the differential resistance $R_{diff}$ has been determined are indicated in the Figures. The differential resistance $R_{diff}$ is a measure of the local curvature of the characteristics. A low differential resistance $R_{diff}$ at high current loads are desired to improve the surge current robustness of the diode. As can be gathered from FIGS. 8 and 9, the differential resistance $R_{diff}$ can be adapted particularly by changing the layout and design of the first doping regions.

As described above, providing regions of differently high doping concentration but of same conductivity type below (in projection) of the second emitter region forming an anode region to form a structured first emitter region forming a cathode region of a diode improves the emitter efficiency and reducing switching losses. The higher doped regions (first doping regions) form ohmic contact with the first emitter metallization (cathode metallization) while the lower doped regions (second doping regions) form non-ohmic contacts, particularly Schottky contacts, with the first emitter metallization.

Spatially relative terms such as "under", "below", "lower", "over", "upper" and the like are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A power semiconductor diode, comprising:
   a semiconductor substrate comprising a first emitter region of an n-conductivity type, a second emitter region of a p-conductivity type, and a drift region of the n-conductivity type arranged between the first emitter region and the second emitter region, the drift region forming a pn junction with the second emitter region;
   a first emitter metallization in contact with the first emitter region, the first emitter region comprising a first doping region of the n-conductivity type and a second doping region of the n-conductivity type, the first doping region forming an ohmic contact with the first emitter metallization, the second doping region forming a non-ohmic contact with the first emitter metallization;
   a second emitter metallization in contact with the second emitter region; and
   a field stop region of the n-conductivity type between the drift region and the first emitter region, the field stop region having a doping concentration higher than the drift region and lower than the first doping region of the first emitter region, the field stop region being at least in direct contact with the first doping region of the first emitter region;
   wherein the semiconductor substrate has a second surface on which the second emitter metallization is formed, a first surface opposite the second surface on which the first emitter metallization is formed, and a lateral edge that is parallel to the first surface and perpendicular to a vertical direction that is normal to the first surface and the second surface; the second emitter region is spaced apart from the lateral edge by a first distance; and the first doping region is spaced apart from the lateral edge at least by the first distance.

2. A power semiconductor diode according to claim 1, wherein the non-ohmic contact is a Schottky contact.

3. A power semiconductor diode according to claim 1, wherein the first doping region has a higher surface doping concentration than the second doping region.

4. A power semiconductor diode according to claim 3, wherein the first doping region has a surface doping concentration of at least $10^{19}/cm^3$.

5. A power semiconductor diode according to claim 3, wherein the second doping region has a surface doping concentration of less than $10^{19}/cm^3$.

6. A power semiconductor diode according to claim 1, wherein the first doping region comprises first dopants of a first doping type and the second doping region comprises second dopants of the first doping type, wherein the second dopants are different than the first dopants.

7. A power semiconductor diode according to claim 6, wherein the second dopants are selected from the group consisting of selenium, sulphur, titanium, and bismuth.

8. A power semiconductor diode according to claim 1, wherein the first emitter metallization comprises a first metal region comprised of a first metal and a second metal region comprised of a second metal different than the first metal, wherein the first metal region is in contact with the first doping region of the first emitter region and the second metal region is in contact with the second doping region of the first emitter region.

9. A power semiconductor diode according to claim 8, wherein the first metal is comprised of aluminium, aluminium alloy, or titanium.

10. A power semiconductor diode according to claim 8, wherein the second metal is comprised of titanium, titanium alloy, tungsten, or tungsten alloy.

11. A power semiconductor diode according to claim 1, wherein the drift region has a doping concentration lower than the doping concentration of the first doping region of the first emitter region and is at least in direct contact with the first doping region of the first emitter region.

12. A power semiconductor diode according to claim 1, further comprising a plurality of spaced apart first doping regions.

13. A power semiconductor diode according to claim 1, further comprising a plurality of spaced apart second doping regions.

14. A power semiconductor diode according to claim 1, wherein the second doping region is formed by portions of the drift region.

15. A power semiconductor diode according to claim 1, further comprising a field stop region of the first conductivity type between the drift region and the first emitter region, the field stop region having a doping concentration higher than the doping concentration of the drift region and lower than the doping concentration of the first doping region of the first emitter region, wherein the second doping region is formed by portions of the field stop region.

16. A power semiconductor diode according to claim 1, wherein the first emitter region forms a cathode region and the second emitter region forms an anode region of the power semiconductor diode.

17. A power semiconductor diode, comprising:
a semiconductor substrate comprising an n-type cathode region, a p-type anode, and an n-type drift region forming a pn junction with the anode region;
an anode metallization in contact with the anode region;
a cathode metallization in contact with the cathode region, the cathode region comprising first n-type doping regions forming ohmic contacts with the cathode metallization and at least one second n-type doping laterally adjacent the first doping regions and forming a Schottky contact with the cathode metallization;
wherein the semiconductor substrate has a second surface on which the anode metallization is formed, a first surface opposite the second surface on which the cathode metallization is formed, and a lateral edge that is parallel to the first surface and perpendicular to a vertical direction that is normal to the first surface and the second surface; the anode is spaced apart from the lateral edge by a first distance; and the first n-type doping region is spaced apart from the lateral edge at least by the first distance.

18. A power semiconductor diode according to claim 17, wherein the at least one n-type second doping region is formed by portions of the drift region.

19. A power semiconductor diode according to claim 17, further comprising an n-type field stop region having a doping concentration which is higher than the doping concentration of the drift region and lower than the doping concentration of the first n-type doping regions of the cathode region, wherein the at least one second n-type doping region is formed by portions of the field stop region.

20. A power semiconductor diode according to claim 17, wherein the first n-type doping regions comprise first dopants and the at least one second n-type doping region comprises second dopants different to the first dopants.

21. A power semiconductor diode according to claim 17, wherein the cathode metallization comprises first metal regions comprised of a first metal and second metal regions comprised of a second metal different than the first metal, and wherein the first metal regions are in contact with the first n-type doping regions of the cathode region and the second metal regions are in contact with the at least one second n-type doping region of the cathode region.

* * * * *